United States Patent [19]

Suzuki et al.

[11] Patent Number: 5,532,910
[45] Date of Patent: Jul. 2, 1996

[54] HYBRID INTEGRATED CIRCUIT AND PROCESS FOR PRODUCING SAME

[75] Inventors: Yasutoshi Suzuki, Okazaki; Kenichi Ao, Tokai; Yoshimi Yoshino, Inuyama; Ryoichi Narita, Obu; Hiroshi Omi, Anjo, all of Japan

[73] Assignee: Nippondenso Co., Ltd., Kariya, Japan

[21] Appl. No.: 502,580

[22] Filed: Jul. 14, 1995

Related U.S. Application Data

[63] Continuation of Ser. No. 51,934, Apr. 26, 1993, abandoned.

[30] Foreign Application Priority Data

Apr. 28, 1992 [JP] Japan ................... 4-137712

[51] Int. Cl.⁶ .................................................. H05K 5/02
[52] U.S. Cl. .......... 361/813; 361/761; 361/776; 361/807; 174/52.4; 257/690; 257/693
[58] Field of Search ................... 361/738, 763, 361/765, 776, 761, 807, 813, 743, 762, 711; 174/52.2, 52.4, 250, 260; 257/690, 692, 693, 696

[56] References Cited

U.S. PATENT DOCUMENTS 4,794,048 12/1988 Oboodi et al. ................. 428/432
5,057,906 10/1991 Ishigami ......................... 357/80

FOREIGN PATENT DOCUMENTS 50-47566  4/1975  Japan.
60-34265  8/1985  Japan.

*Primary Examiner*—Leo P. Picard
*Assistant Examiner*—Y. Whang
*Attorney, Agent, or Firm*—Cushman, Darby & Cushman

[57]  ABSTRACT

A hybrid integrated circuit having a lead frame electrically connected to electronic components by means of a silver (Ag) paste, the hybrid integrated circuit comprising: an electroless-plated coating on the lead frame, the coating being free from an insulating surface oxide layer at least in a connection area in which the electrical connection is provided. A process of producing this hybrid integrated circuit comprises: a first step of electroless-plating a lead frame by using a phosphorus-containing reducing agent to form a coating on the lead frame; a second step of mounting electronic components on the lead frame and then electrically and mechanically connecting the former to the latter by means of an electroconductive paste; and a third step of maintaining the surface of the electroless-plated coating free from a phosphorus-containing oxide layer during the connecting operation.

7 Claims, 8 Drawing Sheets

CHIP CAPACITOR — Ag-PASTE

CHIP CAPACITER — Ag-PASTE — Cu-LEAD FRAME — Ni-COATING

| ELEMENT & LINE | | WEIGHT PERCENT | ATOMIC PERCENT |
|---|---|---|---|
| O | Kα | 1.57 | 5.19 |
| P | Kα | 6.10 | 10.41 |
| Ni | Kα | 87.20 | 78.54 |

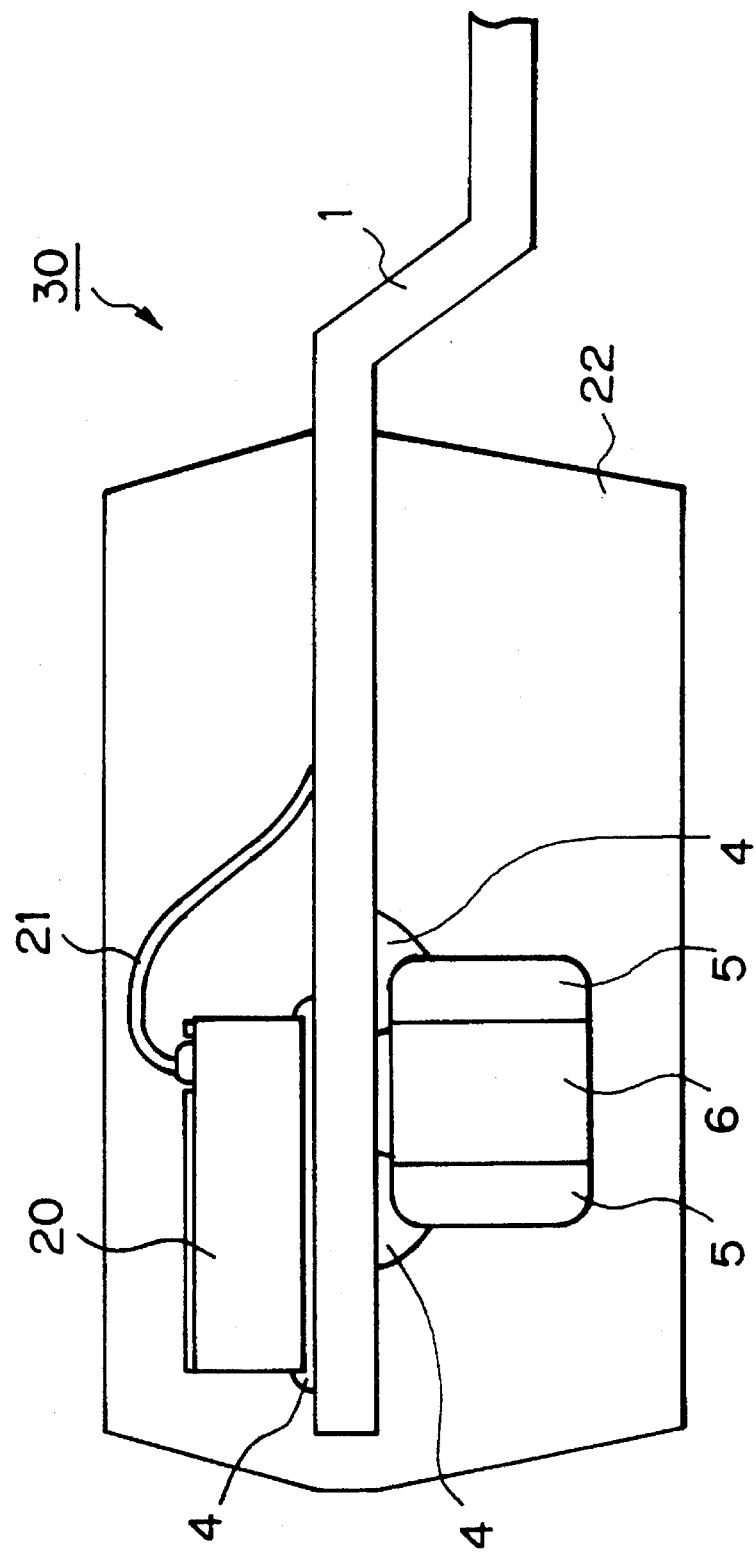

HYBRID INTEGRATED CIRCUIT AND PROCESS FOR PRODUCING SAME

This is a continuation of application Ser. No. 08/51,934, filed on Apr. 26, 1993, which was abandoned upon the filing hereof.

BACKGROUND OF THE INVENTION

1. Field of the Invention

The present invention relates to a hybrid integrated circuit fabricated by lead-bonding electronic components by means of a lead frame, followed by resin sealing, and to a process of producing same.

2. Description of the Related Art

There is conventionally known a hybrid integrated circuit fabricated by lead-bonding a plurality of electronic components (such as IC chips and chip capacitors) onto a lead frame, followed by resin sealing. The lead bonding of electronic components to a lead frame includes electrical connection using a silver (Ag) paste, which is a common conductive paste material.

The lead frame has an electrolytically plated nickel (Ni) coating for connection to external terminals and for corrosion prevention. In this case, the use of an Ag paste can ensure a resistivity of 1 Ω or less at the electrical connection between the lead frame and the electronic components.

SUMMARY OF THE INVENTION

The present inventors conducted a study to use a phosphorus-reduced electroless Ni plating (hereinafter also referred to as "electroless Ni(P) plating") instead of electrolytic Ni plating.

This is intended to take advantage of the fact that the melting point of the Ni coating is made lower than the lead frame material such as copper (Cu) when formed by electroless Ni(P) plating, so that resistance welding can be used for bonding the lead frame to the external terminals in the later process stage. For example, assembling of a sensor can be carried out through less process steps with less components by the use of resistance welding when bonding the outer leads of a lead frame having electronic components mounted thereon to external connector terminals provided on the sensor casing. A lead frame made of Cu is hereinafter referred to as a Cu lead frame.

Occasionally, a chip capacitor is mounted on a lead frame so as to be connected in series with the output terminals of a silicon IC chip for removing electric noise.

However, a problem arose in that a lead frame coated by eletroless Ni(P) plating exhibits a resistivity of as high as several hundred Ω at the electric connection between the lead frame and the chip capacitor.

This substantially means that the ability of the chip capacitor to remove electrical noise changes.

To clarify what causes the high resistivity when a lead frame is coated by electroless Ni(P) plating, the present inventors made various studies and obtained the results shown in FIG. 1.

A chip capacitor is electrically connected to a Cu lead frame coated by electroless Ni(P) plating, by using an Ag paste. FIG. 1 also show the resistivity obtained for a Cu lead frame coated by electrolytic Ni plating. The circular, square and triangular plots represent the resistivities between the Cu lead frame and a silver-palladium (Ag—Pd) electrode of the chip capacitor, between the Cu lead frame and the Ag paste and of the Ag paste itself, respectively.

It can be seen from FIG. 1 that all of these three resistivities are substantially zero for a lead frame with an Ni coating formed by electrolytic Ni plating. On the other hand, for a lead frame with an Ni coating formed by electroless Ni(P) plating, the resistivities represented by the circular and square plots exceeded 10 Ω although the resistivity represented by the triangular plot remained substantially zero.

This result shows that a high resistivity portion is present between the Cu lead frame and the Ag paste.

The top surface of the electroless Ni(P) plated layer, i.e., the bond interface between the Ag paste and the former was sliced and subjected to observation by an electron microscope at magnifications of from 200,000 to 1,000,000 to detect an altered layer composed of aggregated particles with several tens nm in diameter.

As can be seen from an X-ray analysis as shown in FIG. 2, the altered layer is substantially composed of phosphorus (P), oxygen (O) and nickel (Ni) and forms a surface oxide layer of the electroless Ni(P)-plated coating. The carbon (C) and silver (Ag) in the Ag paste are also detected. It is thus clarified that an Ni—P—O oxide layer is present on the surface of an electroless Ni(P)-plated coating and acts as an insulating substance to increase the resistivity of the electric connection thereat.

FIGS. 3A to 3D show the resistivity between the Ag—Pd electrode of a chip capacitor and the electroless Ni(P)-plated coating, for various concentrations of phosphorus (P) in the latter. The axis of ordinate indicates the frequency (number of occurrence) of the observed resistivity (Ω) indicated by the axis of abscissa in a logarithmic scale.

As can be seen from FIG. 3A, high resistivities are observed in some samples even when the P concentration is 1%. Namely, an electroless Ni(P)-plated coating, at least when formed by using sodium hypophosphite as a reducing agent, have a high resistivity layer intervening between itself and the Ag paste layer and causing fluctuation in resistivity as observed above.

Thus, the present inventors found that the conventional hybrid integrated circuit with the lead frame coated by electroless Ni(P) plating unavoidably includes a high resistance connected in series in electronic components such as chip capacitors.

The present invention is intended to clarify an oxide or insulating layer on the interface between plated coating and the Ag paste layer and to provide measures to eliminate the conventional disadvantage caused thereby.

The present invention is made from this point of view and its object is to provide a hybrid integrated circuit provided with stable values of design parameters by reducing the resistivity at the electrical connection between the electronic component and the plated lead frame.

To achieve the object according to the first aspect of the present invention, there is provided a hybrid integrated circuit having a lead frame electrically connected to electronic components by means of a silver (Ag) paste, the hybrid integrated circuit comprising an electroless-plated coating on the lead frame, the coating being free from an insulating surface oxide layer at least in a connection area in which the electrical connection is provided.

This feature provides an advantage that the present inventive hybrid integrated circuit has good conductivity in the connection area between the plated lead frame and the electronic components mounted thereon, i.e., the resistivity in the connection area is suppressed to a low value and does not fluctuate between products.

According to a preferred embodiment of the first aspect of the present invention, any insulating surface oxide layer formed on the electroless-plated coating in the connection area is removed by adding a reducing agent in the silver paste.

This feature provides an advantage that the addition of a reducing agent in a silver paste enables any insulating oxide layer on an electroless-plated coating of a lead frame to be easily removed selectively in the connection area, so that the present inventive hybrid integrated circuit has good conductivity in the connection area between the plated lead frame and the electronic components mounted thereon, i.e., the resistivity in the connection area is suppressed to a low value and does not fluctuate between products.

According to another preferred embodiment of the first aspect of the present invention, the insulating surface oxide layer is prevented from being formed in the connection area by plating the electroless-plated coating of the lead frame with an oxidation resisting overcoating.

This feature provides an advantage that the oxidation resisting overcoating plated on the electroless-plated coating of the lead frame avoids formation of an oxide layer on the electroless-plated coating, so that the present inventive hybrid integrated circuit has good conductivity in the connection area between the plated lead frame and the electronic components mounted thereon, i.e., the resistivity in the connection area is suppressed to a low value and does not fluctuate between products.

There is also provided according to the second aspect of the present invention, a process of producing a hybrid integrated circuit, the process comprising the steps of:

a first step of electroless-plating a lead frame by using a phosphorus-containing reducing agent to form a coating on the lead frame;

a second step of mounting electronic components on the lead frame and then electrically and mechanically connecting the former to the latter by means of an electroconductive paste; and a third step of maintaining the surface of the electroless-plated coating free from a phosphorus-containing oxide layer during the connecting operation.

Preferably, the third step includes a step of adding in the electroconductive paste a reducing agent for reducing the phosphorus-containing oxide layer. The reducing agent is typically an imide compound.

Also preferably, the third step comprises removing the phosphorus-containing oxide layer by etching prior to the second step. The etching is preferably carried out by using nitric acid.

Further preferably, the third step comprises plating the electroless-plated coating with an oxidation resisting overcoating subsequent to the first step.

There is provided according to the third aspect of the present invention, a process of producing a hybrid integrated circuit, the process comprising the steps of:

plating a lead frame with nickel by electroless plating using a phosphorus-containing reducing agent;

mounting electronic components on the lead frame, with a silver paste containing an additive of an imide compound intervening therebetween; and curing the silver paste to fasten the electronic components to the lead frame.

There is provided according to the fourth aspect of present invention, a process of producing a hybrid integrated circuit, the process comprising the steps of:

plating a lead frame with nickel by electroless plating using a phosphorus-containing reducing agent;

cleaning the surface of the nickel-plated lead frame with a nitric acid solution;

mounting electronic components on the lead frame with a silver paste intervening therebetween; and curing the silver paste to fasten the electronic components to the lead frame.

There is provide according to the fifth aspect of the present invention, a process of producing a hybrid integrated circuit, the process comprising the steps of:

plating a lead frame with nickel and then with silver by electroless plating using a phosphorus-containing reducing agent;

mounting electronic components on the lead frame, with a silver paste intervening therebetween; and curing the silver paste to fasten the electronic components to the lead frame.

BRIEF DESCRIPTION OF THE DRAWINGS

FIG. 4 shows an inside arrangement of a hybrid integrated circuit of Example 1 according to the present invention;

DESCRIPTION OF THE PREFERRED EMBODIMENTS

Example 1

Figure 1A:
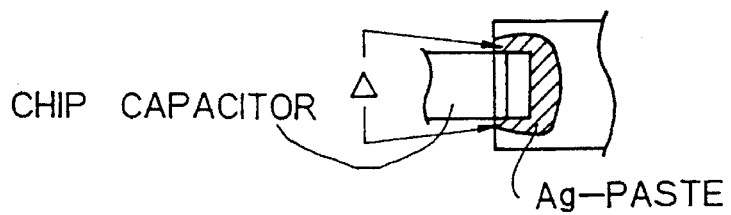
FIG. 1 is a graph showing the resistivity of an electrical connection formed by a silver (Ag) paste intervening a chip capacitor and a Cu lead frame having an electrolytic or electroless Ni(P)-plated coating.
Figure 1B:
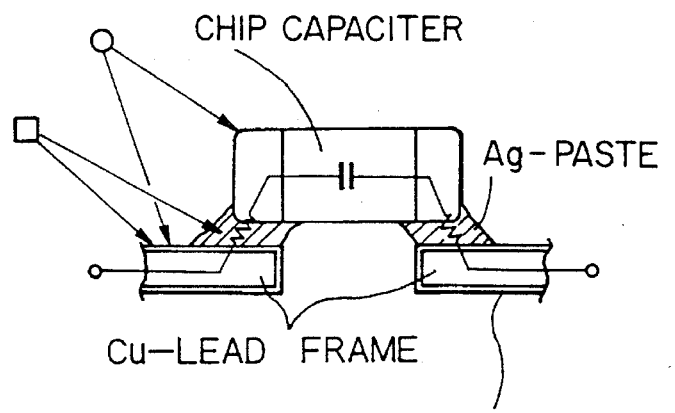
Figure 1C:
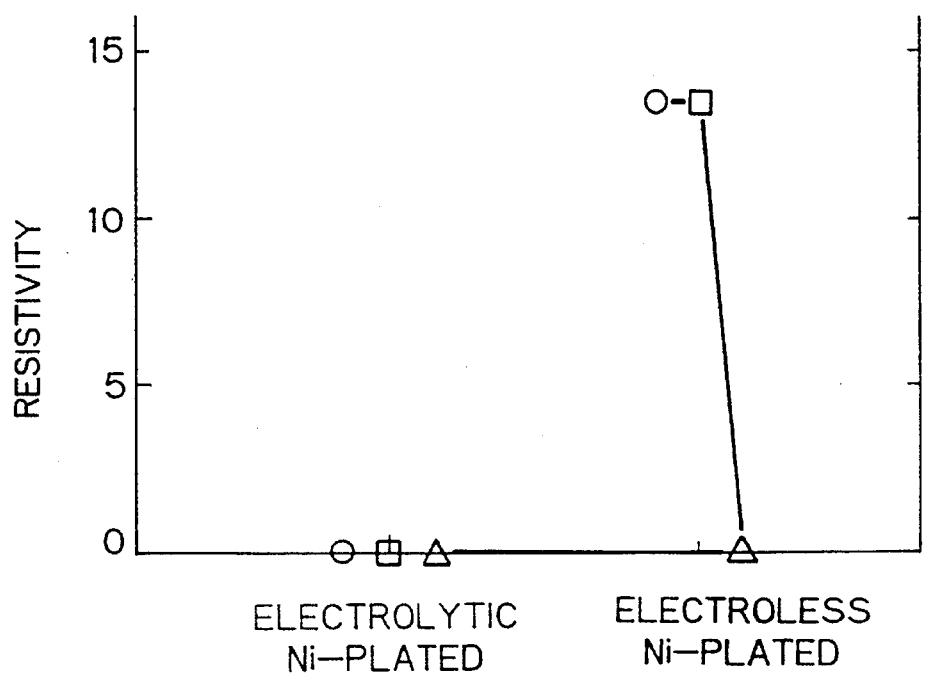
Figures 2A, 2B:
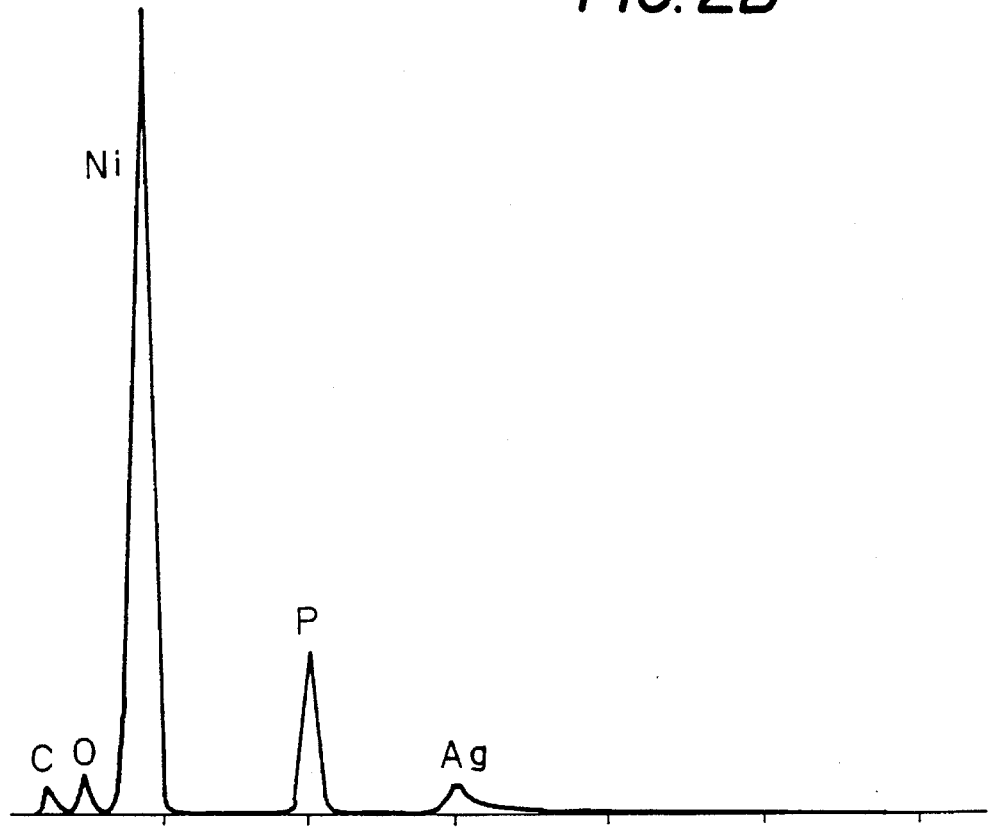
FIG. 2 shows an X-ray analysis of an altered layer.
Figure 3A:
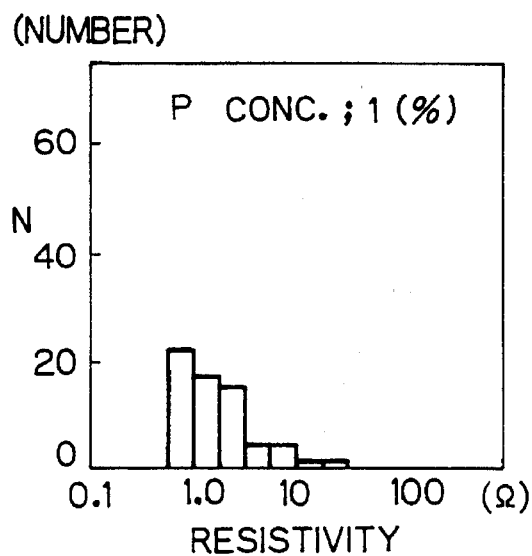
FIGS. 3A to 3D are graphs showing the number of occurrence of the specific resistivity of an electrical connection between the Ag—Pd electrode of a chip capacitor and the electroless Ni(P)-plated coating of a lead frame, for different P concentrations of the coating of 1, 8, 12, and 8 to 12%, respectively.
Figure 3B:
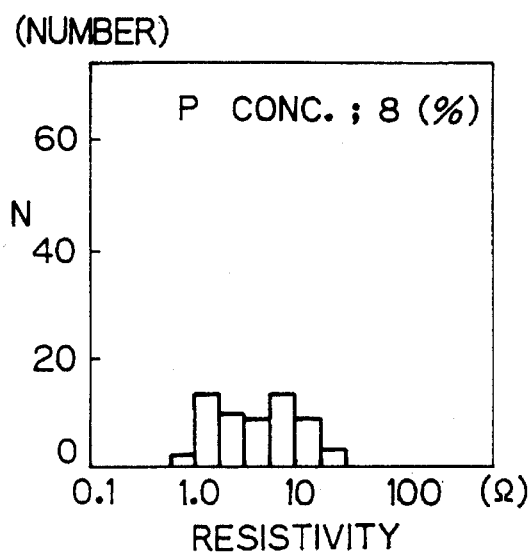
Figure 3C:
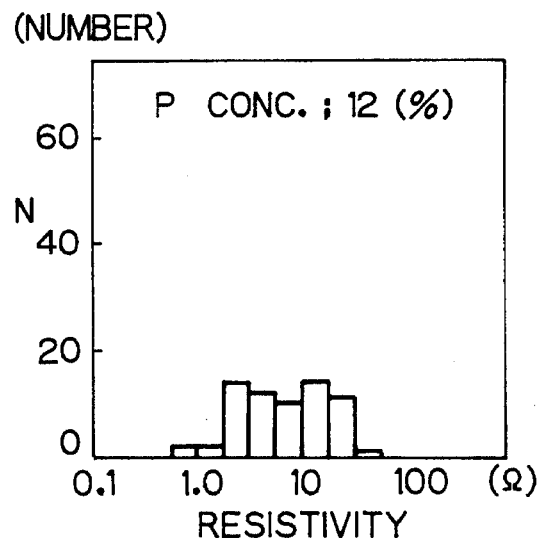
Figure 3D:
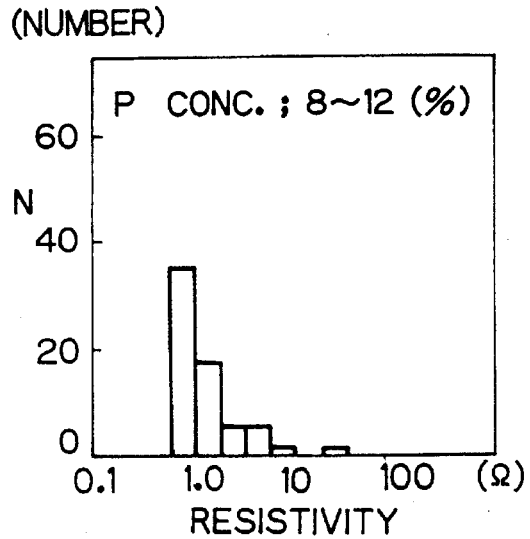

FIG. 4 shows the inside arrangement of a hybrid integrated circuit 30 according to the present invention.

An silicon (Si) IC chip 20 and a chip capacitor 6 are bonded to a Cu lead frame 1. The silicon IC chip 20 has a pair of electrodes, one being electrically connected to the Cu lead frame 1 via a silver paste 4 and the other being also electrically connected to the Cu lead frame 1 via a gold (Au) wire 21. Silver-palladium (Ag—Pd) plated layers 5 provided on both ends of the chip capacitor 6 are electrically connected to the Cu lead frame 1 via a silver paste 4. The hybrid integrated circuit 30 is entirely sealed with a mold resin 22 except for the outer lead of the Cu lead frame 1.

Figure 5:
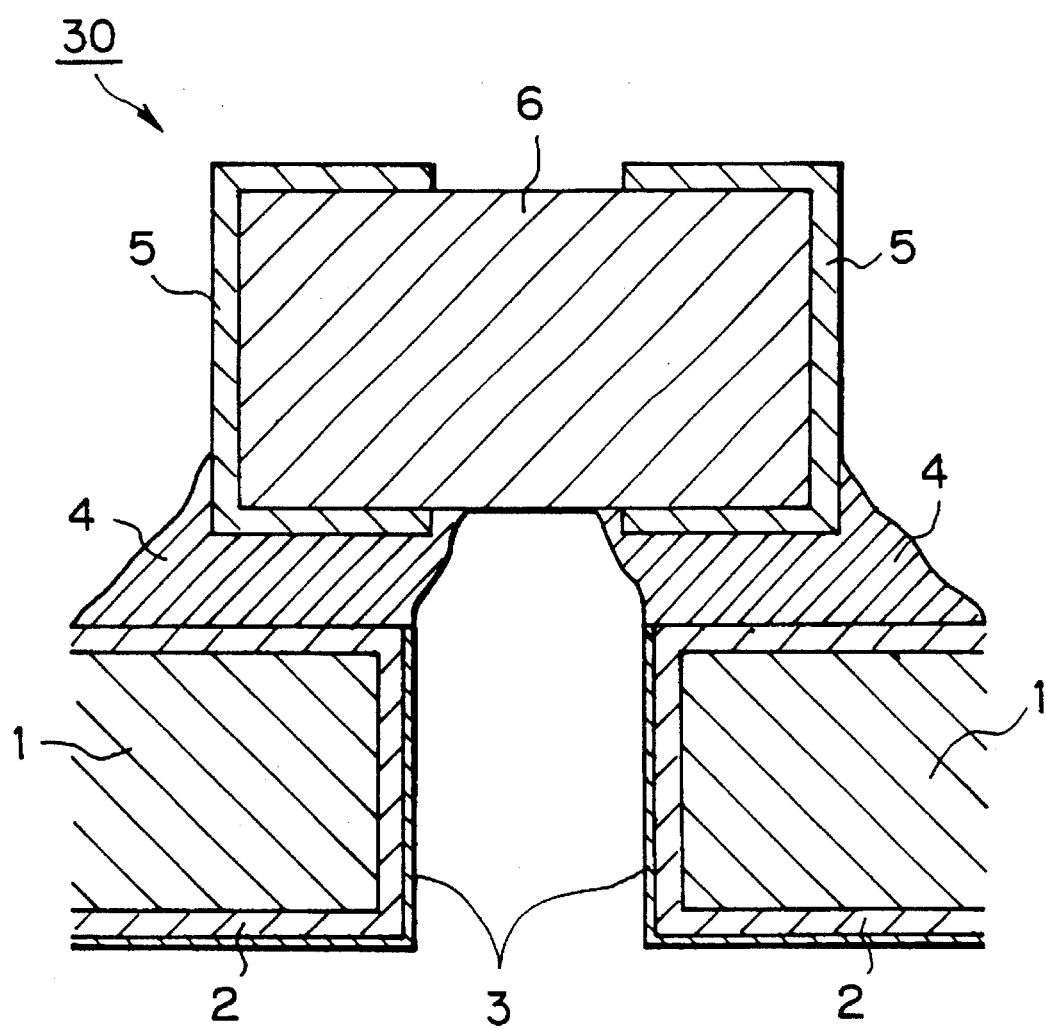
FIG. 5 shows a partial section of the hybrid integrated circuit shown in FIG. 4.

FIG. 5 shows a partial section of the hybrid integrated circuit 30 that includes the bond between the chip capacitor 6 and the Cu lead frame 1.

The chip capacitor absorbs external noise and electrical noise from a power supply line, but cannot so function when the electrical connection between the chip capacitor 6 and the Cu lead frame 1 is insufficient and the resistivity in the connection is thereby raised to change the circuit values out of designed ranges.

The lead frame 1 was subjected to electroless Ni(P) plating using sodium hypophosphite as a reducing agent to form a 2 to 6 μm thick coating thereon for protecting the oxidation-sensitive Cu lead frame surface from oxidation or corrosion.

As hereinabove described, the thus-formed electroless-plated Ni(P) coating contains phosphorus, in which the phosphorus content is controlled to abut 8 to 12% so that resistance welding can be used to bond the lead frame terminal (i.e., outer lead) of the hybrid integrated circuit to an external terminal in the later process step.

The chip capacitor 6 was bonded to the Cu lead frame 1 by means of the intervening silver paste 4 prepared by adding an imide compound (imide carbonyl, in this example) to a commonly used silver paste, i.e., a mixture compound of epoxy resin, a silver powder, and a curing agent.

This bonding was performed by first placing a small amount (0.1 to 0.35 mg) of a silver paste 4 containing an imide compound additive on the electroless Ni(P)-plated coating 2 by means of a dispenser, and then placing on the paste a chip capacitor 6 provided with silver-palladium-plated layers 5 on both sides as a terminal.

The chip capacitor 6 was then pressed from above until the silver paste 4 fits the silver-palladium-plated layers 5 on both sides of the chip capacitor 6.

The silver paste 4 was then cured at 180° C. for 120 min to mechanically bond and electrically connect the chip capacitor 6 to the lead frame 1.

As hereinabove described, the electroless Ni(P)-plated coating 2 formed on the Cu lead frame 1 has an about 10 nm thick oxide layer 3 formed thereon during the plating.

The surface oxide layer 3 is removed by the silver paste 4 containing an imide compound, to ensure direct electrical connection between the silver paste 4 and the electroless Ni(P)-plated coating 2.

Figure 6:
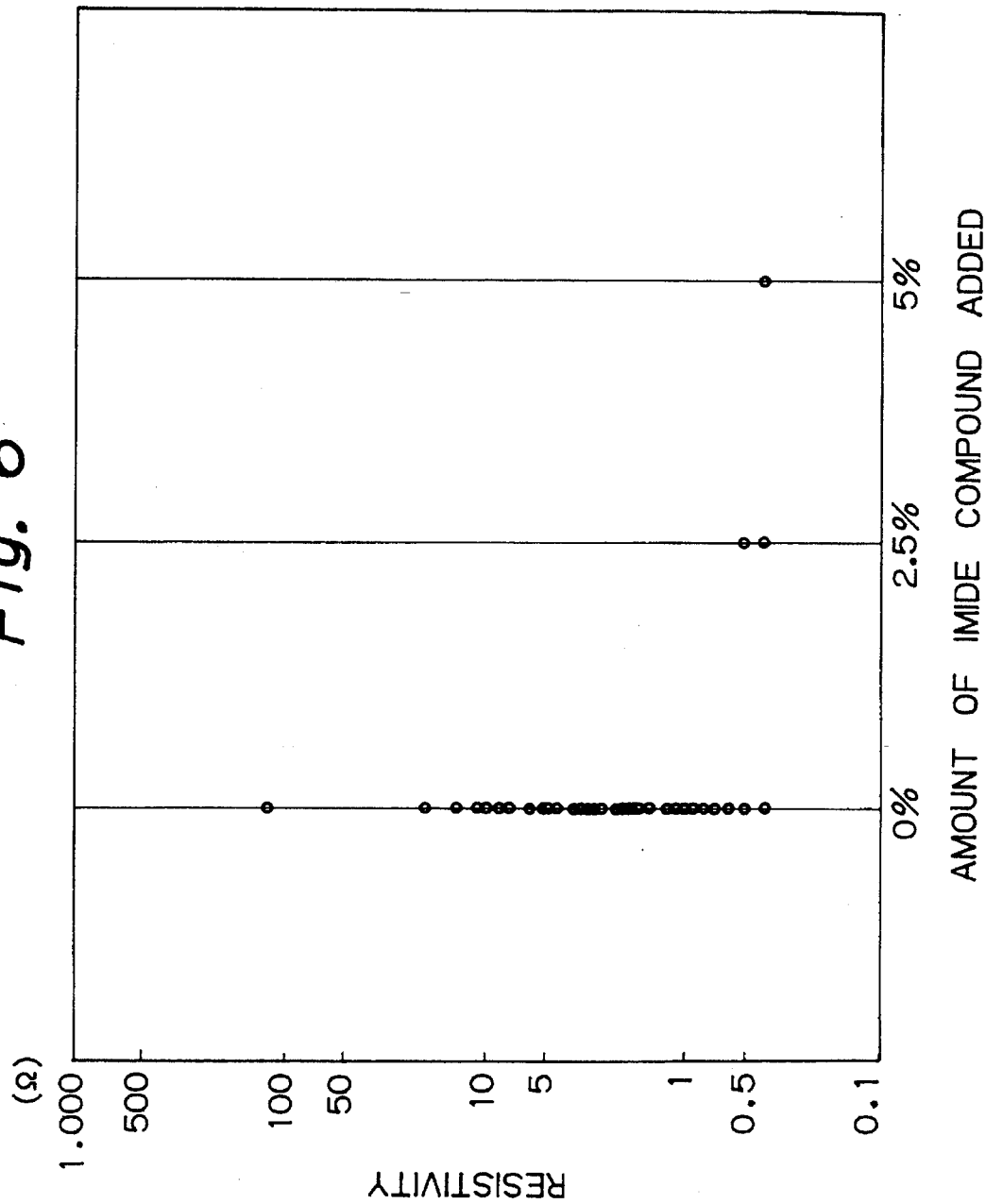
FIG. 6 is a graph showing the relationship between the connection resistivity and the amount of an imide compound added in an Ag paste used in a hybrid integrated circuit.

FIG. 6 shows the relationship between the resistivity (Ω) across such a connection and the amount (%) of imide compound added in the silver paste 4. It can be seen from FIG. 6 that the resistivity fluctuates from 0.4 Ω to 120 Ω for the conventional connection formed by using a silver paste 4 in which imide compound is not added, whereas in the present inventive connection, the resistivity is lowered to 0.5 Ω or less and does not fluctuate when an imide compound is added in the silver paste 4 in amounts of 2.5% or 5%.

Example 2

Figure 7:
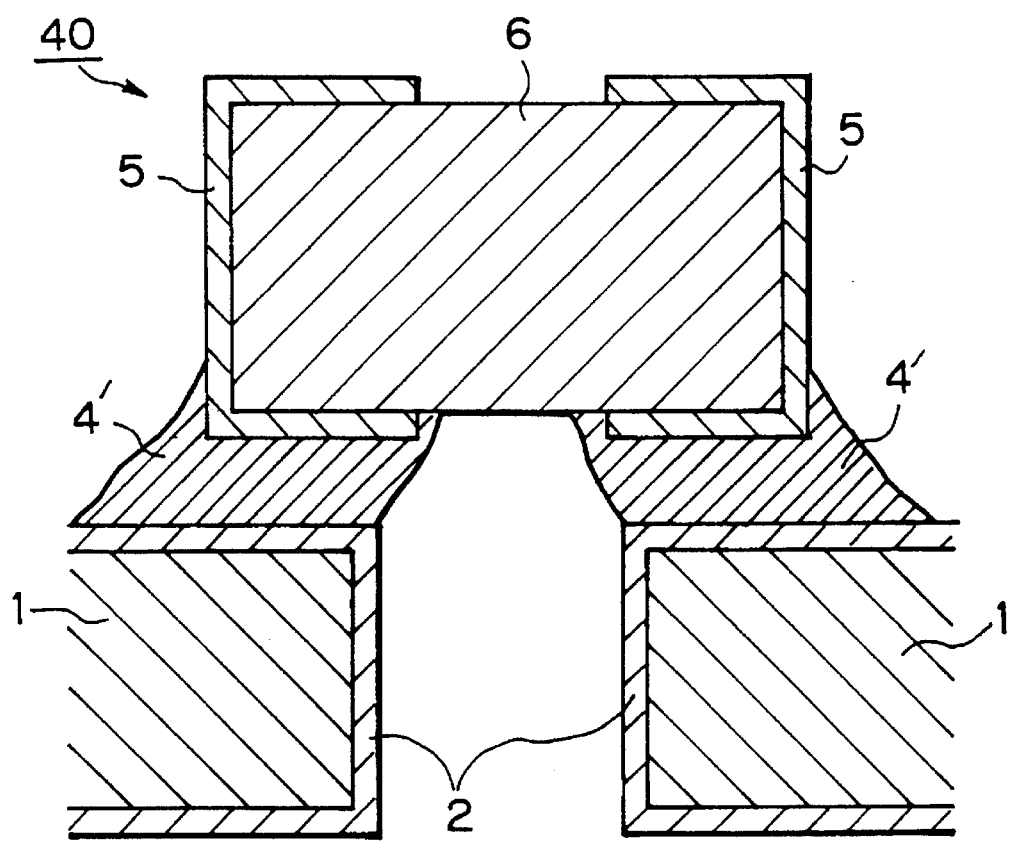
FIG. 7 shows a partial section of a hybrid integrated circuit of Example 2 according to the present invention.

FIG. 7 shows a partial section of a hybrid integrated circuit 40 according to the present invention, the section including the bond between a chip capacitor 6 and a Cu lead frame 1.

Prior to bonding the chip capacitor 6 to the lead frame 1, an Ni—P—O surface oxide layer 3 present on the electroless Ni(P)-plated coating 2 (FIG. 5) was removed by a nitric acid-based etchant.

A small amount (0.1 to 0.35 mg) of a conventional silver paste 4' not containing additives such as an imide compound is placed on the electroless Ni(P)-plated coating 2 by means of a dispenser, and then, a chip capacitor 6, provided with silver-palladium-plated layers 5 on both sides as a terminal, was placed on the paste 4'.

The chip capacitor 6 was then pressed from above until the silver paste 4' fits the silver-palladium-plated layers 5 on both sides of the chip capacitor 6.

The silver paste 4' was then cured at 180° C. for 120 min to mechanically bond and electrically connect the chip capacitor 6 to the lead frame 1.

In the thus-produced hybrid integrated circuit 40 according to the present invention, the resistivity in the connection is lowered to 0.4 Ω or less and does not fluctuate.

Example 3

Figure 8:
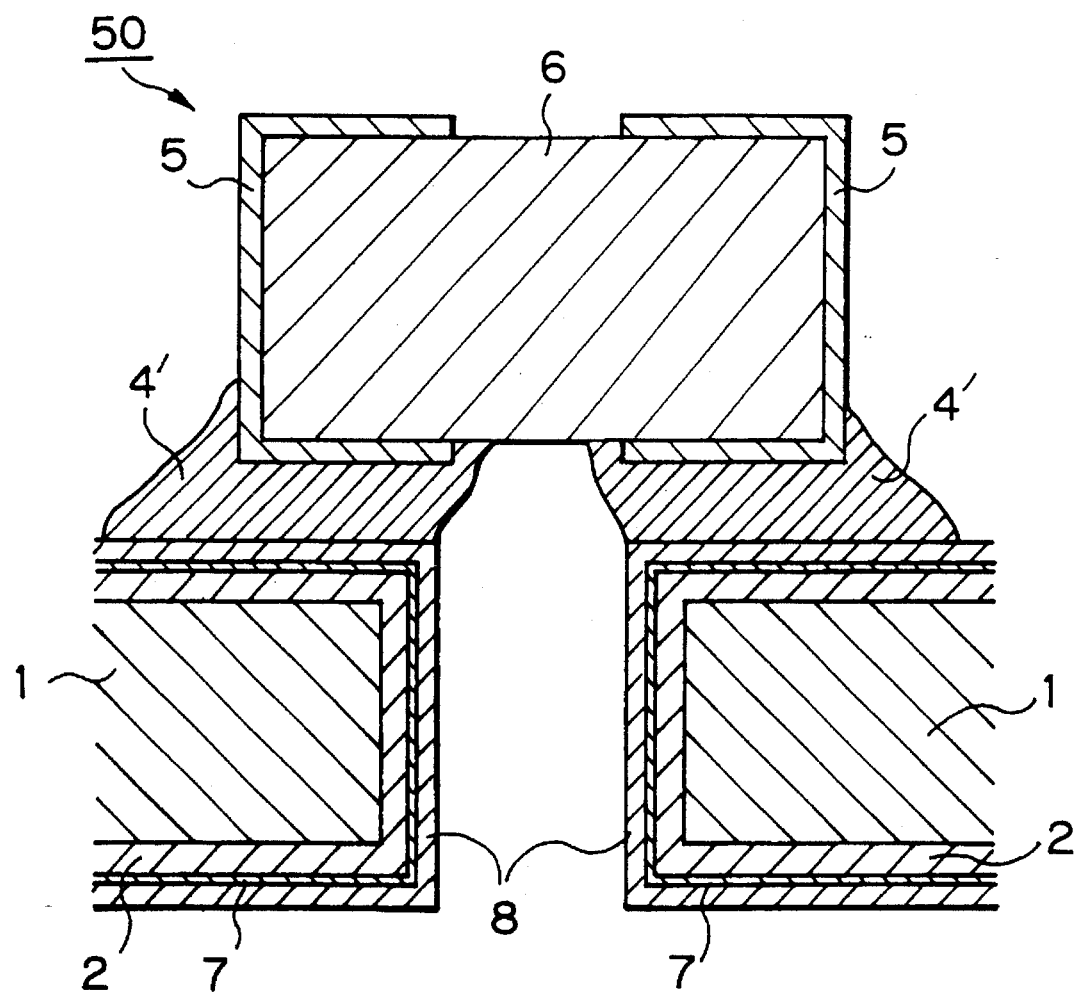
FIG. 8 shows a partial section of a hybrid integrated circuit of Example 3 according to the present invention.

FIG. 8 shows a partial section of a hybrid integrated circuit 50 according to the present invention, the section including the bond between a chip capacitor 6 and a Cu lead frame 1.

To avoid formation of an oxide layer 3 on an electroless Ni(P)-plated coating 2 (2 to 6 μm thick), a continuous plating process was carried out to form an about 0.2 μm thick copper-plated layer 7 on the Ni(P) coating 2 and then form an about 2 μm thick silver-plated layer 8 on the copper-plated layer 7.

A small amount (0.1 to 0.35 mg) of a conventional silver paste 4' not containing additive such as an imide compound is placed on the electroless Ni(P)-plated coating 2 by means of a dispenser, and then, a chip capacitor 6, provided with silver-palladium-plated layers 5 on both sides as a terminal, was placed on the paste 4'.

The chip capacitor 6 was then pressed from above until the silver paste 4' fits the silver-palladium-plated layers 5 on both sides of the chip capacitor 6.

The silver paste 4' was then cured at 180° C. for 120 min to mechanically bond and electrically connect the chip capacitor 6 to the lead frame 1.

In the thus-produced hybrid integrated circuit 50 according to the present invention, an oxide layer 3 is not formed on the electroless Ni(P)-plated layer 2, so that a good conductivity through the connection via the copper- and silver-plated layers 7 and 8 is obtained and the resistivity of the connection is lowered to 0.4 Ω or less and does not fluctuate.

It will be reasonably appreciated by a person skilled in the art that the present invention is not limited to the above-stated preferred embodiments but includes the following modifications.

(1) The Cu lead frame with an electroless Ni(P)-plated coating may be replaced by other suitable lead frames such as those made of 42-alloy.

(2) The electroless Ni plating using sodium hypophosphite as a reducing agent may be replaced by other electroless Ni plating using other agent containing phosphorus (P) than sodium hypophosphite.

(3) The imide compound added in a silver paste, as used in Example 1, may be replaced by other agents capable of reducing and removing an Ni—P—O oxide layer.

(4) The nitric acid-based etchant for removing an insulating oxide layer formed on the electroless Ni-plated coating, as used in Example 2, may be replaced by other etchants such as hydrochloric acid.

(5) The silver-plated layer formed on the outermost surface of a lead frame, as used in Example 3, may be replaced by other plated layer on which insulating layer is not formed, such as a gold-plated layer.

(6) Although the present invention is described with respect to examples in which an insulating layer is formed on an electroless Ni(P)-plated coating of a lead frame, the present invention is also applicable to other electroless-plated coatings on which a phosphorus/oxygen-based insulating layer is formed.

We claim:

1. A hybrid integrated circuit having a lead frame electrically connected to electronic components by means of a silver (Ag) paste, said hybrid integrated circuit comprising:

an electroless-plated coating on said lead frame; a copper-plated layer directly formed on said electroless-plated coating;

a silver-plated area directly formed on said copper-plated layer; and a chip condenser mounted on said lead frame by means of at least said silver (Ag) paste, said silver-plated layer having a surface providing an electric connection area.

2. A hybrid integrated circuit having a lead frame electrically connected to electronic components by means of a silver (Ag) paste, said hybrid integrated circuit comprising:

an electroless-plated coating on said lead frame, said coating being substantially free from an insulated surface oxide layer at least in a connection area in which said electrical connection is provided, and wherein at least a chip condenser is mounted on said lead frame in said connection area.

3. A hybrid integrated circuit according to claim 2, wherein any insulating surface oxide layer formed on said electroless-plated coating in said connection area is removed by adding a reducing agent in said silver paste.

4. A hybrid integrated circuit according to claim 2, wherein a copper-plated layer is formed on an electroless-plated coating and any one of a silver-plated layer and a gold-plated layer is formed on said copper-plated layer.

5. A hybrid integrated circuit having a lead frame electrically connected to electronic components by means of a silver (Ag) paste, said hybrid integrated circuit comprising:

an electroless-plated coating which is phosphorus-reduced on said lead frame, said coating being free from an insulating surface oxide layer at least in a connection area in which said electrical connection is provided.

6. A hybrid integrated circuit having a lead frame electrically connected to electronic components by means of a silver (Ag) paste, said hybrid integrated circuit comprising:

an electroless-plated coating on said lead frame, said coating being free from an insulating surface oxide layer at least in a connection area in which said electrical connection is provided, and wherein any insulating surface oxide layer formed on said electroless-plated coating in said connection area is removed by adding sodium hypophosphite as a reducing agent in said silver paste.

7. A hybrid integrated circuit having a lead frame electrically connected to electronic components by means of a silver (Ag) paste, said hybrid integrated circuit comprising:

an electroless-plated coating on said lead frame, said coating being free from an insulating surface oxide layer at least in a connection area in which said electrical connection is provided, and wherein any insulating surface oxide layer formed on said electroless-plated coating in said connection area is removed by adding in imide compound as a reducing agent in said silver paste.

* * * * *